United States Patent
Jeon et al.

(10) Patent No.: US 9,007,833 B2
(45) Date of Patent: Apr. 14, 2015

(54) 2-TRANSISTOR FLASH MEMORY AND PROGRAMMING METHOD OF 2-TRANSISTOR FLASH MEMORY

(75) Inventors: Chang Min Jeon, Yongin-si (KR); Weonho Park, Hwaseong-si (KR); Byoungho Kim, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 277 days.

(21) Appl. No.: 13/618,263

(22) Filed: Sep. 14, 2012

(65) Prior Publication Data

US 2013/0176786 A1 Jul. 11, 2013

(30) Foreign Application Priority Data

Jan. 6, 2012 (KR) .................. 10-2012-0002044

(51) Int. Cl.
*G11C 11/34* (2006.01)
*G11C 16/04* (2006.01)

(52) U.S. Cl.
CPC .................. *G11C 16/0433* (2013.01)

(58) Field of Classification Search
USPC ............. 365/185.13, 185.18, 185.05, 185.14
See application file for complete search history.

(56) References Cited

U.S. PATENT DOCUMENTS

| | | | |
|---|---|---|---|
| 6,067,254 A | 5/2000 | Kuo et al. | |
| 6,477,088 B2 | 11/2002 | Ogura et al. | |
| 6,587,381 B2 | 7/2003 | Kanai et al. | |
| 6,594,178 B2 * | 7/2003 | Choi et al. | 365/185.17 |
| 7,006,381 B2 | 2/2006 | Dormans et al. | |
| 7,379,335 B2 * | 5/2008 | Futatsuyama | 365/185.17 |
| 2009/0273014 A1 | 11/2009 | Arigane et al. | |
| 2010/0265765 A1 | 10/2010 | Seo et al. | |
| 2011/0175156 A1 | 7/2011 | Okuyama | |

FOREIGN PATENT DOCUMENTS

| | | | |
|---|---|---|---|
| JP | 06302830 A | 10/1994 | |
| JP | 2008027522 A | 2/2008 | |
| JP | 2008226332 A | 9/2008 | |
| JP | 2008287794 A | 11/2008 | |
| KR | 20100115612 A | 10/2010 | |

* cited by examiner

*Primary Examiner* — Son Dinh
(74) *Attorney, Agent, or Firm* — Harness, Dickey & Pierce, P.L.C.

(57) ABSTRACT

Disclosed is a 2-transistor flash memory that includes a memory cell array, a row driver, a read/write circuit, a charge pump generating a high voltage, and control logic configured to transfer the high voltage to the row driver, the read/write circuit, and the memory cell array. If programming, the row driver and the read/write circuit apply voltages such that a control gate of a cell transistor in an unselected memory cell on a different row from a selected memory cell is floated.

20 Claims, 12 Drawing Sheets

| Bias Conditions of Program | Selected | Unselected |
|---|---|---|
| PPW | pVnnh | GND |
| GCL | pVpph | pVnnm |
| WL | pVnnh | pVnnh |
| GBL | pVnnh | GND |
| C/S | Float | Float |
| SSG | pVppm | pVnnh |
| BCL | pVnnm | pVpph |
| DNW | pVpph | pVpph |

2-TRANSISTOR FLASH MEMORY AND PROGRAMMING METHOD OF 2-TRANSISTOR FLASH MEMORY

CROSS-REFERENCE TO RELATED APPLICATIONS

A claim for priority under 35 U.S.C §119 is made to Korean Patent Application No. 10-2012-0002044 filed Jan. 6, 2012, the entirety of which is incorporated by reference herein.

BACKGROUND

Some example embodiments of the inventive concepts described herein relate to a semiconductor memory, and more particularly, relate to a 2-transistor flash memory and/or a method of programming the 2-transistor flash memory.

A semiconductor memory device is a memory device which is fabricated using semiconductors such as silicon (Si), germanium (Ge), gallium arsenide (GaAs), indium phosphide (InP), and the like. Semiconductor memory devices are classified as volatile memory devices and nonvolatile memory devices.

The volatile memory devices may lose stored contents at power-off. The volatile memory devices include a static RAM (SRAM), a dynamic RAM (DRAM), a synchronous DRAM (SDRAM), and the like. The nonvolatile memory devices may retain stored contents even at power-off. The nonvolatile memory devices include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and the like.

An embedded system may use a 2-transistor flash memory that includes memory cells formed of a cell transistor and a selection transistor.

SUMMARY

Some example embodiments of the inventive concepts provide a 2-transistor flash memory that includes a memory cell array including a plurality of memory cells each having a cell transistor and a selection transistor connected in series; a row driver connected to cell transistors of memory cells on the same row via global control lines and byte selection transistors, the row driver connected to selection transistors of memory cells on the same row via word lines; a read/write circuit connected to a plurality of memory cells on the same column via global bit lines and sector selection transistors, and the read/write circuit configured to control the byte selection transistors via byte control lines; a charge pump configured to generate a high voltage; and control logic configured to transfer the high voltage to the row driver, the read/write circuit, and the memory cell array, wherein if programming, the row driver and the read/write circuit are configured to apply voltages such that a control gate of a cell transistor in an unselected memory cell on a different row from a selected memory cell is floated.

In some example embodiments, if programming, the row driver and the read/write circuit apply the same voltage to a global control line and a byte control line corresponding to an unselected memory cell on a different row from a selected memory cell.

In some example embodiments, if programming, the row driver and the read/write circuit are configured to apply the same negative intermediate voltage to a global control line and a byte control line corresponding to an unselected memory cell on the different row from the selected memory cell.

In some example embodiments, if programming, the row driver and the read/write circuit apply a ground voltage to a global control line and a byte control line corresponding to the unselected memory cell on the different row from the selected memory cell.

In some example embodiments, if programming, the row driver applies a first positive high voltage to a selected global control line and the read/write circuit applies a second positive high voltage to an unselected byte control line.

In some example embodiments, if programming, a byte selection transistor connected to a global control line and a byte control line corresponding to the unselected memory cell on the different row from the selected memory cell is turned off by voltages of the global control line and the byte selection transistor.

In some example embodiments, the plurality of memory cells forms a first sector and a second sector, memory cells in each of the first and second sectors form a plurality of strings each including a plurality of memory cells connected in series.

In some example embodiments, each of the plurality of strings is connected to a global bit line via a corresponding sector selection line.

In some example embodiments, if programming, a common source of the selection transistor and the cell transistor is floated.

In some example embodiments, if programming, a negative high voltage is applied to a selected global bit line and a ground voltage is applied to an unselected global bit line.

Some example embodiments of the inventive concepts also provide a program method of a 2-transistor flash memory that includes a plurality of memory cells each having a cell transistor and a selection transistor connected in series, cell transistors in the same row being connected to the same global control line via a byte selection transistor and memory cells in the same column being connected to the same global bit line via sector selection transistor. The program method comprises performing programming by applying a program voltage to a cell transistor of a selected memory cell; and performing program inhibition by floating a control gate of a cell transistor in an unselected memory cell on a different row from the selected memory cell.

In some example embodiments, performing programming comprises applying the same voltage to a global control line connected to the cell transistor of the unselected memory cell and a gate of a byte selection transistor connected to the global control line.

In some example embodiments, the same negative intermediate voltage is applied to the global control line connected to the cell transistor of the unselected memory cell and the gate of the byte control transistor connected to the global control line.

In some example embodiments, a ground voltage is applied to the global control line connected to the cell transistor of the unselected memory cell and the gate of the byte selection transistor connected to the global control line.

In some example embodiments, a byte selection transistor connected with a control gate of the unselected memory cell is turned off.

Some example embodiments of the inventive concepts also provide a 2-transistor flash memory including a row driver connected to a cell transistor of each of a plurality of memory cells on a row via byte selection transistors, and a read/write circuit configured to control the byte selection transistors, wherein if programming a selected memory cell, the row driver and the read/write circuit are configured to apply voltages such that a control gate of a cell transistor in an unselected memory cell on a different row from the selected memory cell is floated.

In some example embodiments, the row driver and the read/write circuit are configured to only float the control gate of the cell transistor in the unselected memory cell if the unselected memory cell is in a selected column, the selected column having a plurality of memory cells including the selected memory cell.

Some example embodiments of the inventive concepts also provide a 2-transistor flash memory including a plurality of rows, each row including a plurality of memory cells, each memory cell including a cell transistor and byte selection transistors connected to each cell transistor and, if programming a selected memory cell, the byte selection transistors are configured to float a control gate of a cell transistor in an unselected memory cell on a different row from the selected memory cell.

In some example embodiments, the byte selection transistors are configured to receive voltages from control logic in order to float the control gate of the cell transistor in the unselected memory cell.

In some example embodiments, the byte selection transistors are configured to only float the control gate of the cell transistor in the unselected memory cell if the unselected memory cell is in a selected column, the selected column having a plurality of memory cells including the selected memory cell.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Example embodiments are described more fully hereinafter with reference to the accompanying drawings, in which example embodiments of the inventive concepts are shown. These example embodiments may, however, be embodied in many different forms and should not be construed as limited to the example embodiments set forth herein. Rather, these example embodiments are provided so that this disclosure will be thorough and complete, and will fully convey the scope of the example embodiments of the inventive concepts to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments of the inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular example embodiments only and is not intended to be limiting of example embodiments of the inventive concepts. As used herein, the singular forms "a", "an" and "the" are intended to include the plural forms as well, unless the context clearly indicates otherwise. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which these example embodiments of the inventive concepts belong. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

The term "selected line" or "selected lines" may be used to indicate a line or lines, associated with a memory cell to be programmed or to be read, from among a plurality of lines. The term "unselected line" or "unselected lines" may be used to indicate a line or lines, associated with a memory cell to be program inhibited or to be read inhibited, from among a plurality of lines.

The term "selected memory cell" or "selected memory cells" may be used to indicate a memory cell or memory cells to be programmed or to be read from among a plurality of memory cells. The term "unselected memory cell" or "unselected memory cells" may be used to indicate the remaining memory cell or the remaining memory cells of a plurality of memory cells other than the selected memory cell or the selected memory cells.

Figure 1:
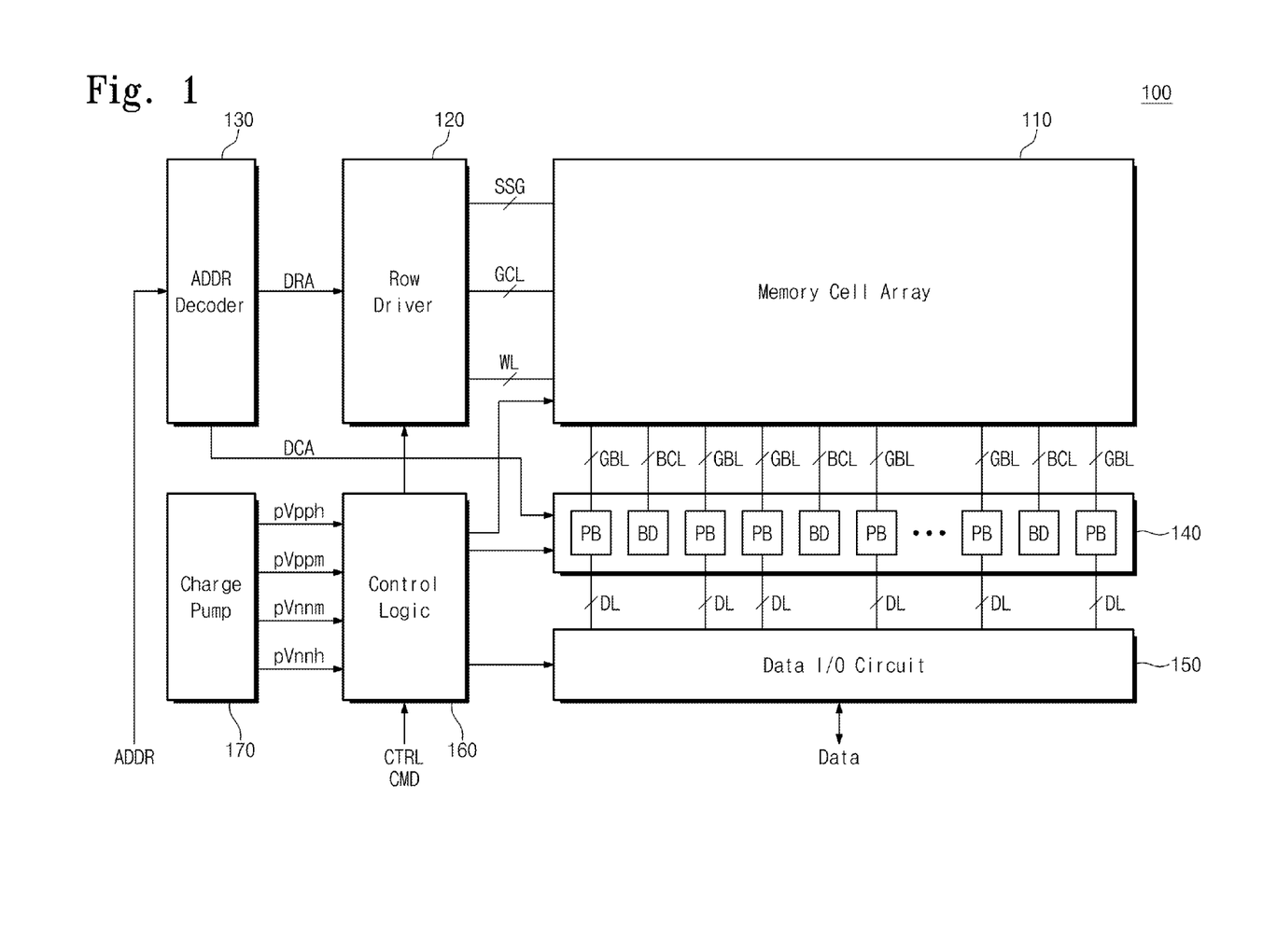
FIG. 1 is a block diagram schematically illustrating a 2-transistor flash memory according to an example embodiment of the inventive concepts.

FIG. 1 is a block diagram schematically illustrating a 2-transistor flash memory according to an example embodiment of the inventive concepts. Referring to FIG. 1, a nonvolatile memory device 100 may include a memory cell array 110, a row driver 120, an address decoder 130, a read/write circuit 140, a data input/output circuit 150, control logic 160, and a charge pump 170.

The memory cell array 110 may be connected to the address decoder 120 via selector selection lines SSG, global control lines GCL, and word lines WL and to the read/write circuit 140 via global bit lines GBL and byte control lines BCL. The memory cell array 110 may include a plurality of memory cells. Each memory cell may include a cell transistor and a selection transistor. Cell transistors arranged in a row direction may be electrically connected to the global control lines GCL, and selection transistors may be electrically connected to word lines WL. Memory cells arranged in a column direction may be electrically connected to global bit lines GBL. The memory cells of the memory cell array 110 may store one or more bits of data.

The row driver 120 may be configured to drive the sector selection lines SSG, the global control lines GCL, and the word lines WL according to the address decoder 130 and the control logic 160.

The address decoder 130 may be configured to operate in response to the control of the control logic 160. The address decoder 130 may receive an address ADDR from an external device. The address decoder 130 may decode a row address of the input address ADDR to transfer a decoded row address DRA to the row driver 120. The row driver 120 may select and un-select the sector selection lines SSG, the global control lines GCL, and the word lines WL according to the decoded row address DRA.

The address decoder 130 may be configured to decode a column address of the input address ADDR. The decoded column address DCA may be transferred to the read/write circuit 140. In some example embodiments, the address decoder 130 may include elements such as a row decoder, a column decoder, an address buffer, and the like.

The read/write circuit 140 may be connected to the memory cell array 110 via the global bit lines GBL and the byte control lines BCL and to the data input/output circuit 150 via the data lines DL. The read/write circuit 140 may operate in response to the control of the control logic 160. The read/write circuit 140 may be configured to receive the decoded column address DCA from the address decoder 130. The read/write circuit 140 may select the global bit lines GBL and the byte control lines BCL using the decoded column address DCA.

In some example embodiments, the read/write circuit 140 may receive data from the data input/output circuit 150 to write in the memory cell array 110. The read/write circuit 140 may read data from the memory cell array 110 to transfer to the data input/output circuit 150.

The read/write circuit 140 may include a plurality of page buffers PB and a plurality of byte drivers BD. The plurality of page buffers PB may be connected with the global bit lines GBL and the data lines DL. The plurality of page buffers PB may write data in memory cells via the global bit lines GBL and read data therefrom via the global bit lines GBL. The plurality of byte drivers BD may be configured to drive the byte control lines BCL. The plurality of byte drivers BD may be configured to select and unselect the byte control lines BCL.

The data input/output circuit 150 may be connected to the read/write circuit 140 via data lines DL. The data input/output circuit 150 may operate in response to the control of the control logic 160. The data input/output circuit 150 may be configured to exchange data with an external device. The data input/output circuit 150 may be configured to transfer data input from an external device to the read/write circuit 140 via the data lines DL. The data input/output circuit 150 may be configured to output data transferred from the read/write circuit 140 via the data lines DL to an external device. In some example embodiments, the data input/output circuit 150 may include elements such as a data buffer and the like.

The control logic 160 may control the row driver 120, the address decoder 130, the read/write circuit 140, and the data input/output circuit 150. The control logic 160 may be configured to control an overall operation of the flash memory device 100. The control logic 160 may operate in response to a control signal CTRL and a command CMD transferred from an external device.

The control logic 160 may receive a positive intermediate voltage pVppm, a positive high voltage pVpph, a negative intermediate voltage pVnnm, and a negative high voltage pVnnh. The control logic 160 may provide the memory cell array 110, the row driver 120, and the read/write circuit 140 with the voltages pVppm, pVpph, pVnnm, and pVnnh. The control logic 160 may provide the memory cell array 110, the row driver 120, and the read/write circuit 140 with the voltages pVppm, pVpph, pVnnm, and pVnnh according to bias conditions if programming, reading, or erasing.

The charge pump 170 may be configured to generate the voltages pVppm, pVpph, pVnnm, and pVnnh. The charge pump 170 may include four charge pump units generating the voltages pVppm, pVpph, pVnnm, and pVnnh, respectively.

Figure 2:
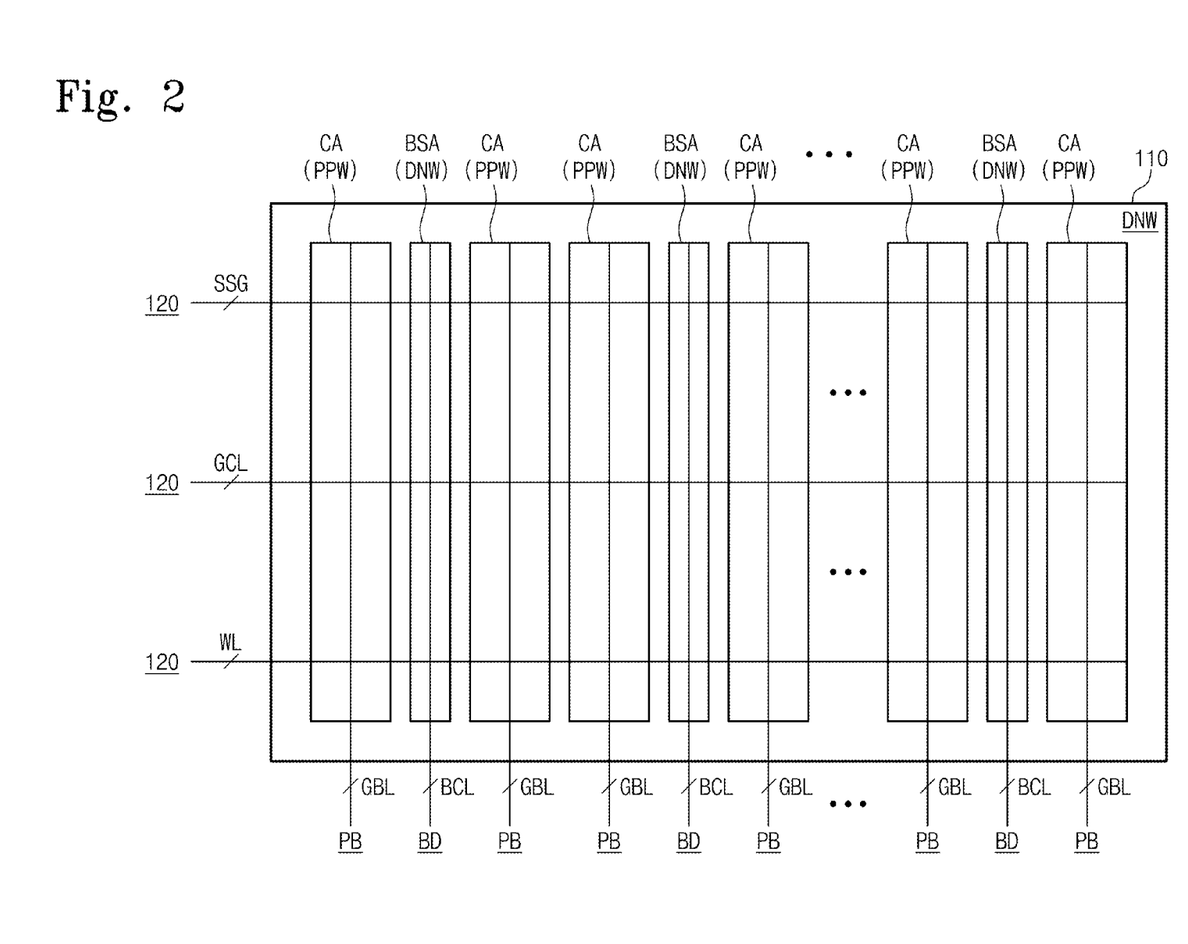
FIG. 2 is a diagram schematically illustrating a memory cell array in FIG. 1.

FIG. 2 is a diagram schematically illustrating a memory cell array in FIG. 1. Referring to FIGS. 1 and 2, a memory cell array 110 may include a plurality of cell areas CA and a plurality of byte selection areas BSA.

The memory cell array 110 may be formed at a deep n-well DNW. A plurality of pocket p-wells PPW may be formed in the deep n-well DNW. The cell areas CA may be formed at the plurality of pocket p-wells PPW. The byte selection areas BSA may be formed at the deep n-well DNW.

One byte selection area BSA may be provided between two adjacent cell areas CA that are closest along a row direction. A pattern formed of two adjacent cell areas CA and a byte selection area BSA provided between the two adjacent cell areas CA may be repeated along a row direction of the memory cell array 110.

Sector selection lines SSG, global control lines GCL, and word lines WL may be formed along a row direction over the whole of the plurality of cell areas CA of the memory cell array 110. The byte control lines BCL may be formed along a column direction over the whole of the plurality of byte selection lines BSA.

Figure 3:
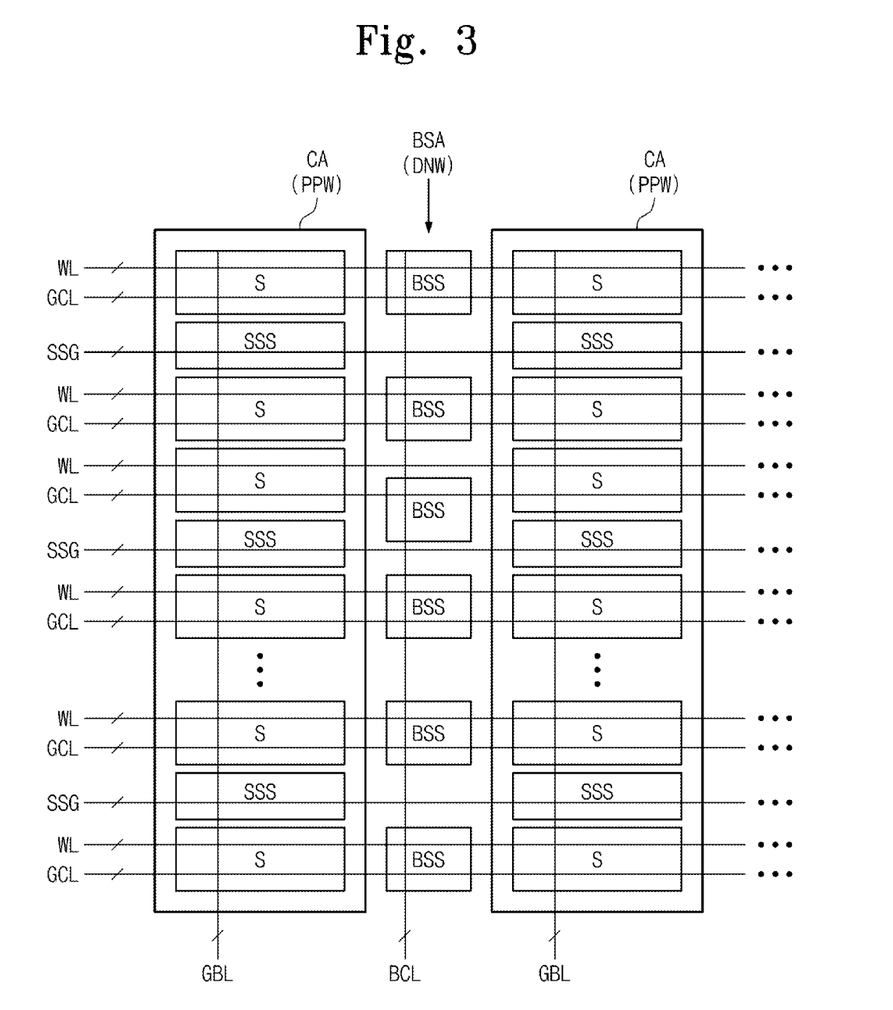
FIG. 3 is a diagram schematically illustrating two adjacent cell areas CA and a byte selection area BSA provided between the adjacent cell areas according to an example embodiment.

FIG. 3 is a diagram schematically illustrating two adjacent cell areas CA and a byte selection area BSA provided between the adjacent cell are as according to an example embodiment. Referring to FIGS. 1 and 3, a plurality of sectors S and a plurality of sector selection switches SSS may be formed at each cell area CA. One sector selection switch SSS may be provided between two sectors S placed to be closest along a column direction. A pattern formed of two adjacent sectors S and one sector selection switch SSS may be repeated along a column direction of a memory cell array 110.

The byte selection area BCA may include a plurality of byte selection switches BSS provided along a column direction. For example, byte selection switches BSS may be placed between two corresponding sectors S of two adjacent cell areas CA as illustrated in FIG. 3.

Word lines WL and global control lines GCL may be provided over sectors S of the cell areas CA along a row direction. Sector selection lines SSG may be provided over the sector selection switches SSS of the cell areas CA. Each sector selection switch SSS may select one of two adjacent sectors according to a corresponding sector selection line SSG.

Global bit lines GBL may be provided over selectors S and sector selection switches SSS of cell areas CA along a column direction. Byte control lines BCL may be provided over the plurality of byte selection switches BSS along a column direction. The byte selection switches BSS may select one of adjacent cell areas CA according to the byte control lines BCL.

Figure 4:
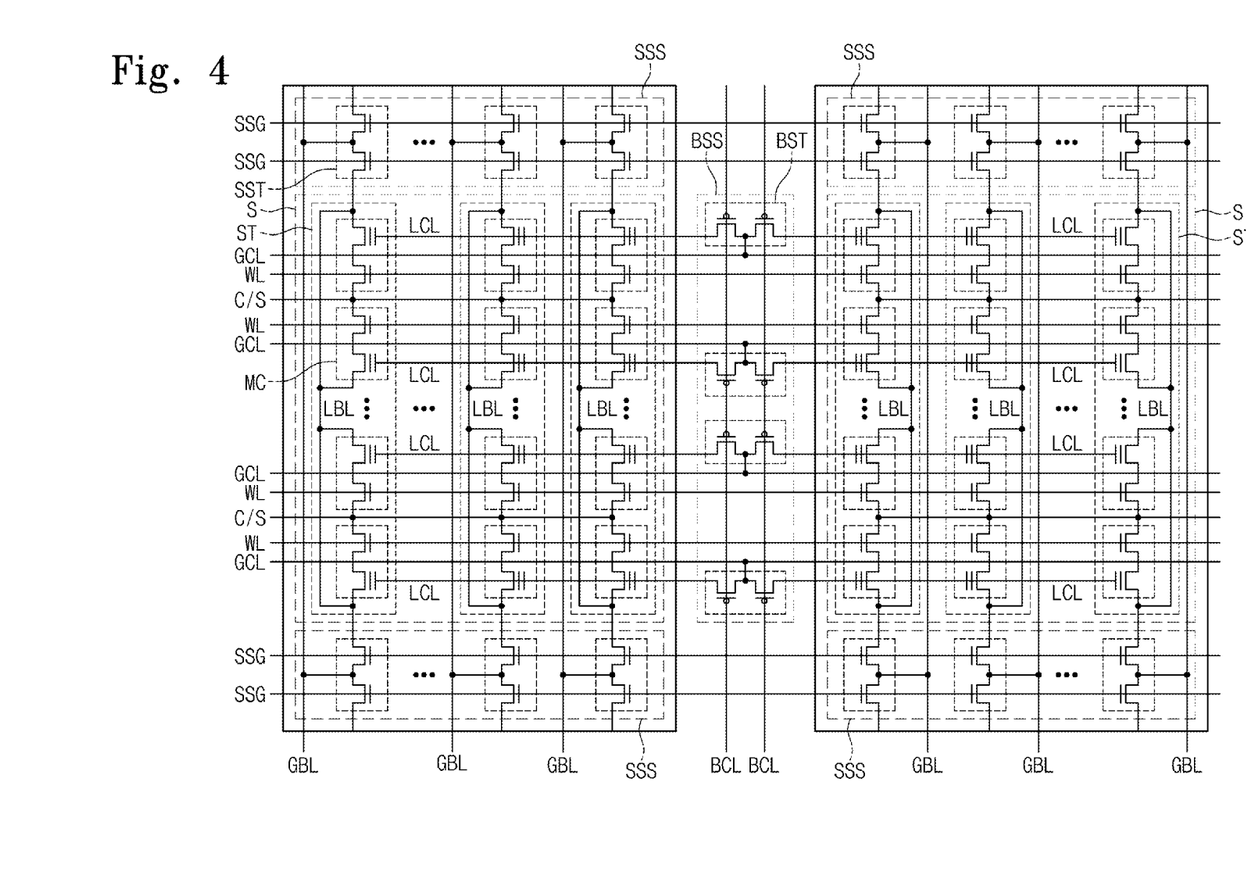
FIG. 4 is a circuit diagram of a part of cell areas and byte selection areas in FIG. 3.

FIG. 4 is a circuit diagram of a part of cell areas and byte selection areas in FIG. 3. In FIG. 4, there are illustrated adjacent selectors S of two adjacent cell areas CA, a byte selection switch BSS between the two adjacent cell areas CA, and adjacent sector selection switches SSS in sectors S.

Each sector S may include a plurality of memory cells MC. The memory cells MC may be serially connected to form one string ST. A plurality of strings ST may be connected in parallel to form a sector S.

Each memory cell MC may include one cell transistor and one selection transistor that are connected in series. A cell transistor in each memory cell MC may be connected to a corresponding local bit line LBL. Each local bit line LBL may be connected to a corresponding global bit line GBL via a sector selection transistor SST of a corresponding sector selection switch SSS. A selection transistor in each memory cell MC may be connected to a common source C/S.

Sector selection lines SSG may be connected to gates of sector selection transistors SST of sector selection switches SSS. Local bit lines LBL may be connected to global bit lines GBL via sector selection transistors SST according to sector selection lines SSG. For example, the sector selection lines SSG may control sector selection transistors SST to select one of adjacent sectors S.

The global control lines GCL may be connected to local control lines LCL via byte selection transistors BST of byte selection switches BSS. The local control lines LCL may be connected to control gates of cell transistors. The byte control lines BCL may be connected to gates of the byte selection transistors BST. For example, the byte control lines BCL may control the byte selection transistors BST to electrically connect the global control lines GCL and the local control lines LCL. One of two adjacent cell areas CA may be selected by the byte control lines BCL.

Word lines WL may be connected to gates of selection transistors of memory cells.

Cell transistors of memory cells in the same row may be connected with the same global control line GCL. Selection transistors of memory cells in the same row may be connected to the same word line WL. Cell transistors of memory cells in the same column may be connected to the same global bit line GBL.

Figure 5:
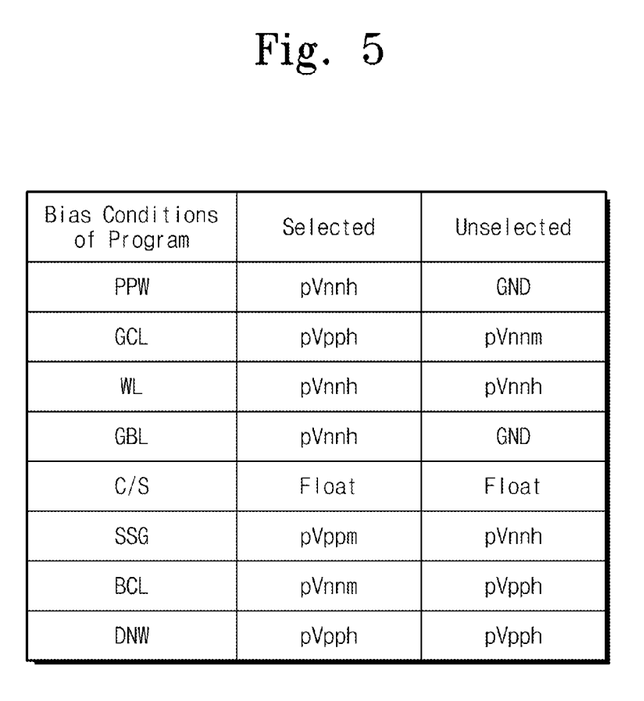
FIG. 5 is a table illustrating bias conditions applied to a memory cell array if programming according to an example embodiment.

FIG. 5 is a table illustrating bias conditions applied to a memory cell array if programming according to an example embodiment. Referring to FIG. 5, a negative high voltage pVnnh may be applied to a selected pocket p-well PPW, and a ground voltage GND may be applied to unselected pocket p-wells PPW.

A positive high voltage pVpph may be applied to a selected global control line GCL, and a negative intermediate voltage pVnnm may be applied to unselected global control lines GCL. A negative high voltage pVnnh may be applied to a selected word line WL, and a negative high voltage pVnnh may be applied to unselected word lines.

A negative high voltage pVnnh may be applied to a selected global bit line GBL, and a ground voltage GND may be applied to unselected global bit lines GBL. A selected common source C/S may be floated, and unselected common sources C/S may be floated.

A positive intermediate voltage pVppm may be applied to a selected sector selection line SSG, and a negative high voltage pVnnh may be applied to unselected sector selection lines SSG. A negative intermediate voltage pVnnm may be applied to a selected byte control line BCL, and a positive high voltage pVpph may be applied to unselected byte selection lines BCL. A positive high voltage pVpph may be applied to a deep n-well.

Figure 6:
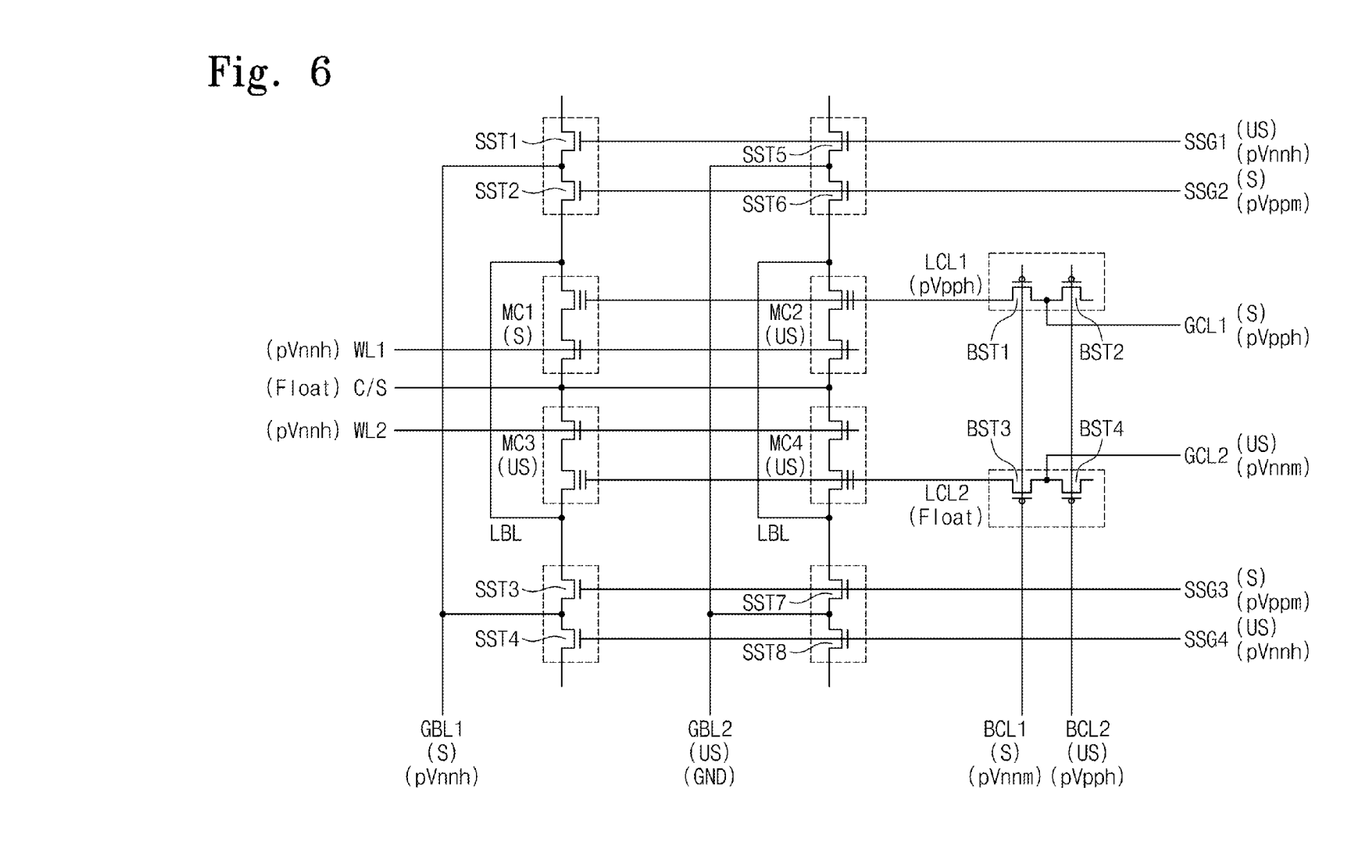
FIG. 6 is circuit diagram describing voltages applied to bias conditions in FIG. 5 if programming.

FIG. 6 is circuit diagram describing voltages applied to bias conditions in FIG. 5 if programming. FIG. 6 illustrates four memory cells MC1 to MC4 arranged in two rows and two columns, sector selection transistors SST1 to SST8 associated with the four memory cells MC1 to MC4, and byte selection transistors BST1 to BST4 associated with the four memory cells MC1 to MC4. It is assumed that the memory cell MC1 is programmed and the remaining memory cells MC2 to MC4 are program inhibited. In FIG. 6, 'S' may be used to indicate a selected line or element, and 'US' may be used to indicate an unselected line or element.

Referring to FIGS. 5 and 6, a positive intermediate voltage pVppm may be applied to selected sector selection lines SSG2 and SSG3 corresponding to a selected memory cell MC1, and a negative high voltage pVnnh may be applied to unselected sector selection lines SSGI and SSG4. Sector selection transistors SST2, SST3, SST6, and SST7 connected with the selected sector selection lines SSG2 and SSG3 may be turned on, and memory cells MC1 to MC4 of a sector including the selected memory cell MCI may be electrically connected to global bit lines GBL1 and GBL2. Sector selection transistors SST1, SST4, SSTS, and SST8 connected to unselected sector selection lines SSG1 and SSG4 may be turned off, and memory cells in unselected sectors may be isolated from the global bit lines GBL1 and GBL2.

A negative intermediate voltage pVnnm may be applied to a selected byte control line BCL1 corresponding to the selected memory cell MC1, and a positive high voltage pVpph may be applied to an unselected byte control line BCL2. Byte selection transistors BST2 and BST4 connected to the unselected byte control line BCL2 may be turned off. For example, memory cells MC of an unselected cell area CA may be electrically isolated from the global control lines GCL1 and GCL2.

A positive high voltage pVpph may be applied to a global control line GCL1 corresponding to the selected memory ell MC1. A byte selection transistor BST1 corresponding to the selected memory cell MC1 may be turned on to transfer the positive high voltage pVpph applied to the global control line GCL11 to a control gate of a cell transistor in the selected memory cell MC1.

A negative high voltage pVnnh may be applied to a global bit line GBL1 corresponding to the selected memory cell MC1. Sector selection transistors SST2 and SST3 corresponding to the selected memory cell MC1 may transfer the negative high voltage pVnnh applied to the global bit line GBL1 to a source/drain of the selected memory cell MC1.

A ground voltage GND may be applied to a global bit line GBL2 corresponding to the unselected memory cell MC2. Sector selection transistors SST6 and SST7 corresponding to the unselected memory cell MC2 may transfer the ground voltage GND applied to the global bit line GBL2 to a source/drain of a cell transistor in the unselected memory cell MC2.

A negative intermediate voltage pVnnm may be applied to an unselected global control line GCL2. For example, in a byte selection transistor BST3 corresponding to memory cells MC3 and MC4 in a row different from the selected memory cell MC1, a negative intermediate voltage pVnnm may be applied to a gate, and a negative intermediate voltage pVnnm may be applied to a source/drain. With this bias condition, the byte selection transistor BST3 may be turned off, and control gates of cell transistors in the memory cells MC3 and MC4 in a different row from the selected memory cell MC1 may be floated.

Figure 7:
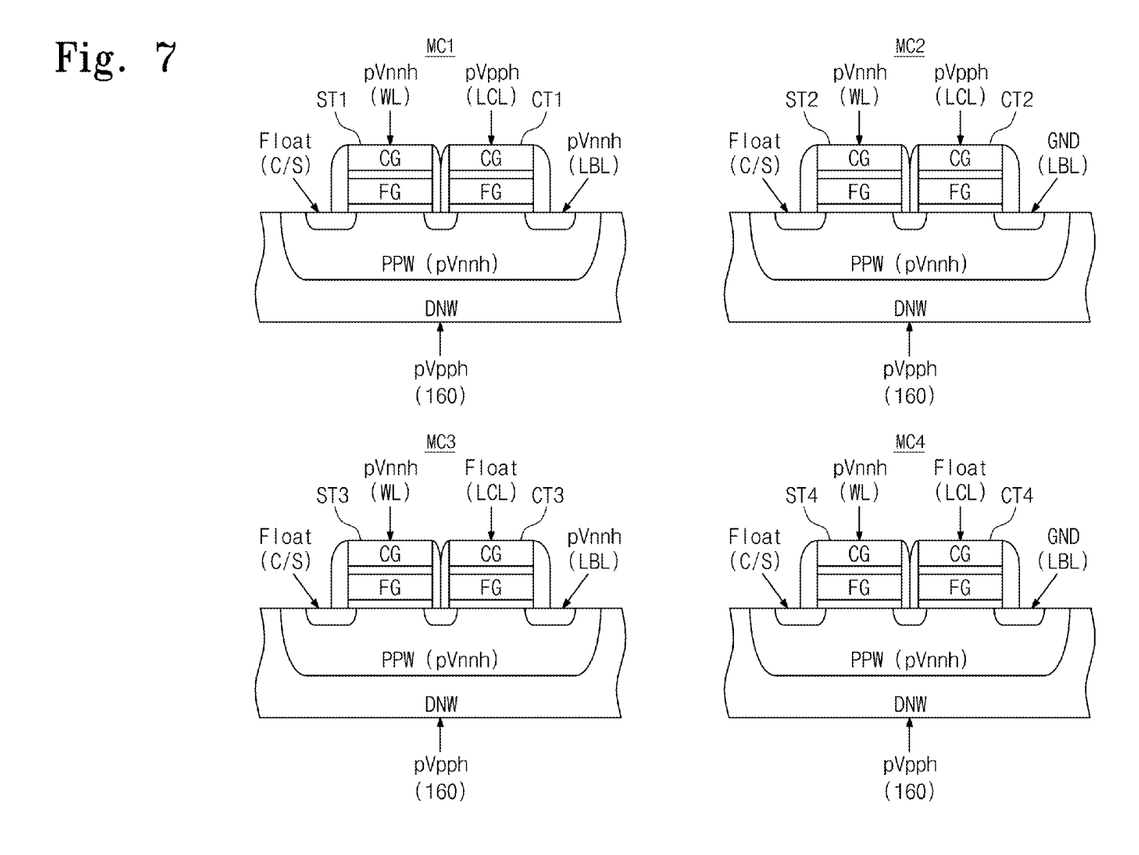
FIG. 7 is a diagram illustrating memory cells according to bias conditions in FIG. 6.

FIG. 7 is a diagram illustrating memory cells according to bias conditions in FIG. 6. Referring to FIGS. 6 and 7, a positive high voltage pVpph may be applied to a control gate of a cell transistor CT1 in a selected memory cell MC1, and a negative high voltage pVnnh may be applied to a junction of a pocket p-well PPW and a global bit line GBL1. When a negative high voltage pVnnh is applied to a gate of a selection transistor ST1, the selection transistor ST1 may be turned off.

A positive high voltage pVpph may be applied to a control gate of a cell transistor CT1 in the selected memory cell MC1, and a negative high voltage pVnnh may be applied to the junction of the pocket p-well PPW and the global bit line GBL1. This bias condition may satisfy a Fowler-Nordheim tunneling condition on a cell transistor CT1. For example, the cell transistor CT1 may be programmed.

A positive high voltage pVpph may be applied to a control gate of a cell transistor CT2 of a program-inhibited memory cell MC2 in the same row as the selected memory cell MC1 (e.g., connected with the same global control line GCL1). A negative high voltage pVnnh may be supplied to a pocket p-well PPW of the cell transistor CT2, and a ground voltage GND may be applied to an unselected global bit line GBL2. Thus, the cell transistor CT2 may be program inhibited.

As described in relation to FIG. 6, a byte selection transistor BST3 corresponding to memory cells MC3 and MC4 in a different row from the selected memory cell MC1 may be turned off. Thus, control gates of cell transistors in the memory cells MC3 and MC4 may be floated.

A negative high voltage pVnnh may be supplied to a pocket p-well PPW of the memory cell MC3, a selected global bit line GBL1 and a gate of a selection transistor ST3. Since a control gate of a cell transistor CT3 is floated, a voltage of a control gate of the cell transistor CT3 may be lowered by the coupling upon applying of the negative high voltage pVnnh. Thus, the cell transistor CT3 of the memory cell MC3 may be program inhibited.

A negative high voltage pVnnh may be applied to a pocket p-well PPW of a memory cell MC4 and a gate of a selection transistor ST4, and a ground voltage GND may be supplied to an unselected global bit line GBL2. Since a control gate of the cell transistor CT4 is floated, a voltage of a control gate of the cell transistor CT4 may be lowered by the coupling upon applying of the negative high voltage pVnnh. Thus, the cell transistor CT4 of the memory cell MC4 may be program inhibited.

In a conventional case, in a selected sector S, a byte selection transistor BST3 corresponding to memory cells MC3 and MC4 in a different row from a selected memory cell MC1 may be turned off, while a ground voltage GND may be applied to control gates of cell transistors CT3 and CT4 of the memory cells MC3 and MC4 via the byte selection transistor BST3.

If a ground voltage GND is supplied to a control gate of a cell transistor CT3, FN tunneling program disturbance may be generated due to a voltage difference between a gate control of the cell transistor CT3 and a pocket p-well (i.e., a GND-pVnnh voltage difference).

If a ground voltage GND is supplied to a control gate of a cell transistor CT4, a voltage of a floating junction between the cell transistor CT4 and a selection transistor ST4 may be lowered due to a voltage pVnnh of a pocket p-well PPW. BTBT (Band-to-band tunneling) may be generated due to a voltage difference between the floating junction and a control gate of the cell transistor CT4. This may mean that hot electron-hole pairs are generated. The hot electrons may be injected into a floating gate of the cell transistor CT4 due to a voltage difference between a control gate of the cell transistor CT4 and a pocket p-well PPW (i.e., a GND-pVnnh voltage difference). For example, the cell transistor CT4 may experience hot electron injection program disturbance.

In some example embodiments, control gates of memory cells MC3 and MC4 in a different row from a selected memory cell MC1 may be floated. Thus, it is possible to prevent the FN tunneling program disturbance from being generated at a cell transistor CT3 of the memory cell MC3 and the hot electron injection program disturbance from being generated at the memory cell MC4. As a result, a 2-transistor flash memory 100 with the improved reliability may be provided.

Figure 8:
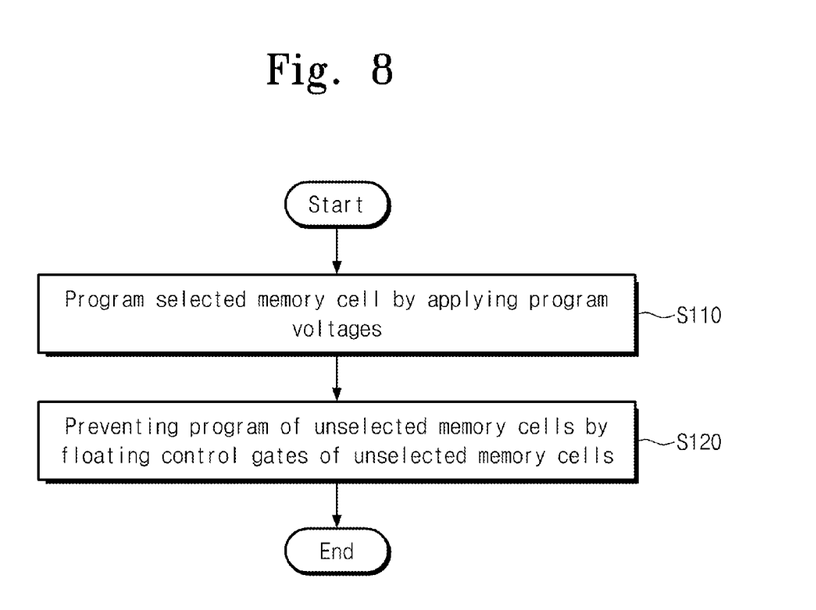
FIG. 8 is a flowchart describing a program method according to an example embodiment of the inventive concepts.

FIG. 8 is a flowchart describing a program method according to an example embodiment of the inventive concepts. Referring to FIGS. 7 and 8, in operation S110, a selected memory cell may be programmed by applying program voltages. In operation S120, unselected memory cells MC3 and MC4 may be program inhibited by floating control gates of the unselected memory cells MC3 and MC4 in a different row from the selected memory cell MC1. Thus, a 2-transistor flash memory 100 with the improved reliability may be provided.

Figure 9:
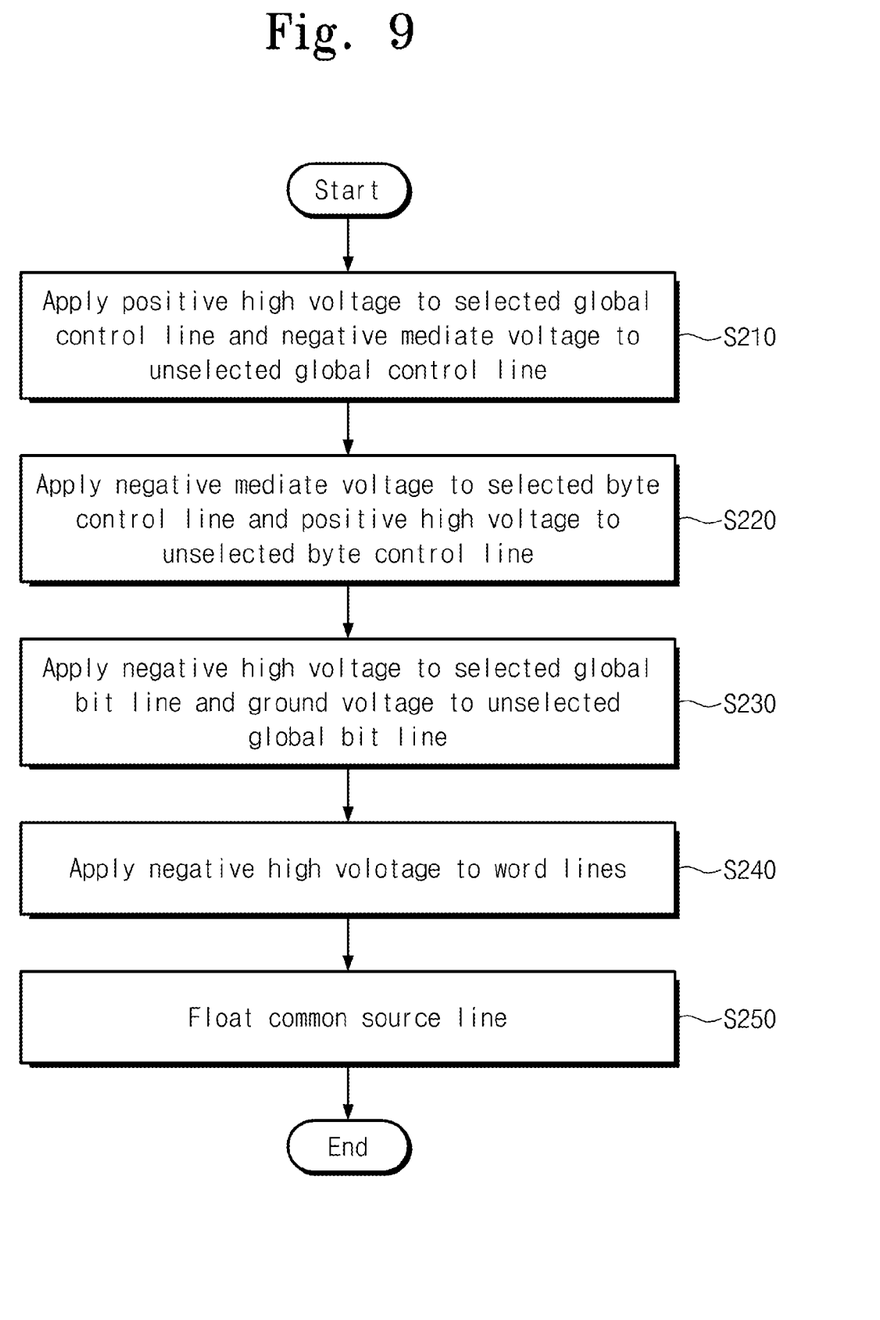
FIG. 9 is a flowchart describing a program method in FIG. 1.

FIG. 9 is a flowchart describing a program method in FIG. 1. Referring to FIGS. 7 and 9, in operation S210, a positive high voltage pVpph may be applied to a selected global control line GCL1, and a negative intermediate voltage pVnnm may be applied to an unselected global control line GCL2.

In operation S220, a negative intermediate voltage pVnnm may be applied to a selected byte control line BCL1, and a positive high voltage pVpph may be applied to an unselected byte control line BCL2.

In operation S230, a negative high voltage pVnnh may be applied to a selected global bit line GBL1, and a ground voltage GND may be applied to an unselected global bit line GBL2.

In operation S240, a negative high voltage pVnnh may be applied to word lines WL1 and WL2. In operation S250, a common source C/S may be floated.

A negative intermediate voltage pVnnm may be applied to a gate of a byte selection transistor BST3 corresponding to memory cells MC3 and MC4 in a different row from the selected memory cell MC1, and a negative intermediate voltage pVnnm may be applied to a source/drain. With this bias condition, the byte selection transistor BST3 may be turned off, and control gates of memory cells MC3 and MC4 may be floated.

In some example embodiments, there is described the case that control gates of memory cells MC3 and MC4 are floated by applying a negative intermediate voltage pVnnm to an unselected global control line GCL2 and a selected byte control line BCL1. However, example embodiments of the inventive concepts are not limited thereto. The byte selection transistor BST3 can be turned off by applying the same voltage as a voltage applied to a selected byte control line BCL1 to an unselected global control line GCL2. For example, when a ground voltage GND is applied to the selected byte control line BCL1, it may be applied to the unselected global control line GCL2.

In some other example embodiments, although the voltage applied to the selected byte control line BCL1 is not in use, the unselected global control line GCL2 can be supplied with a voltage sufficient to turn off a byte control transistor BST3 corresponding to memory cells MC3 and MC4 in a different row from a selected memory cell MC1 of a selected sector.

Figure 10A:
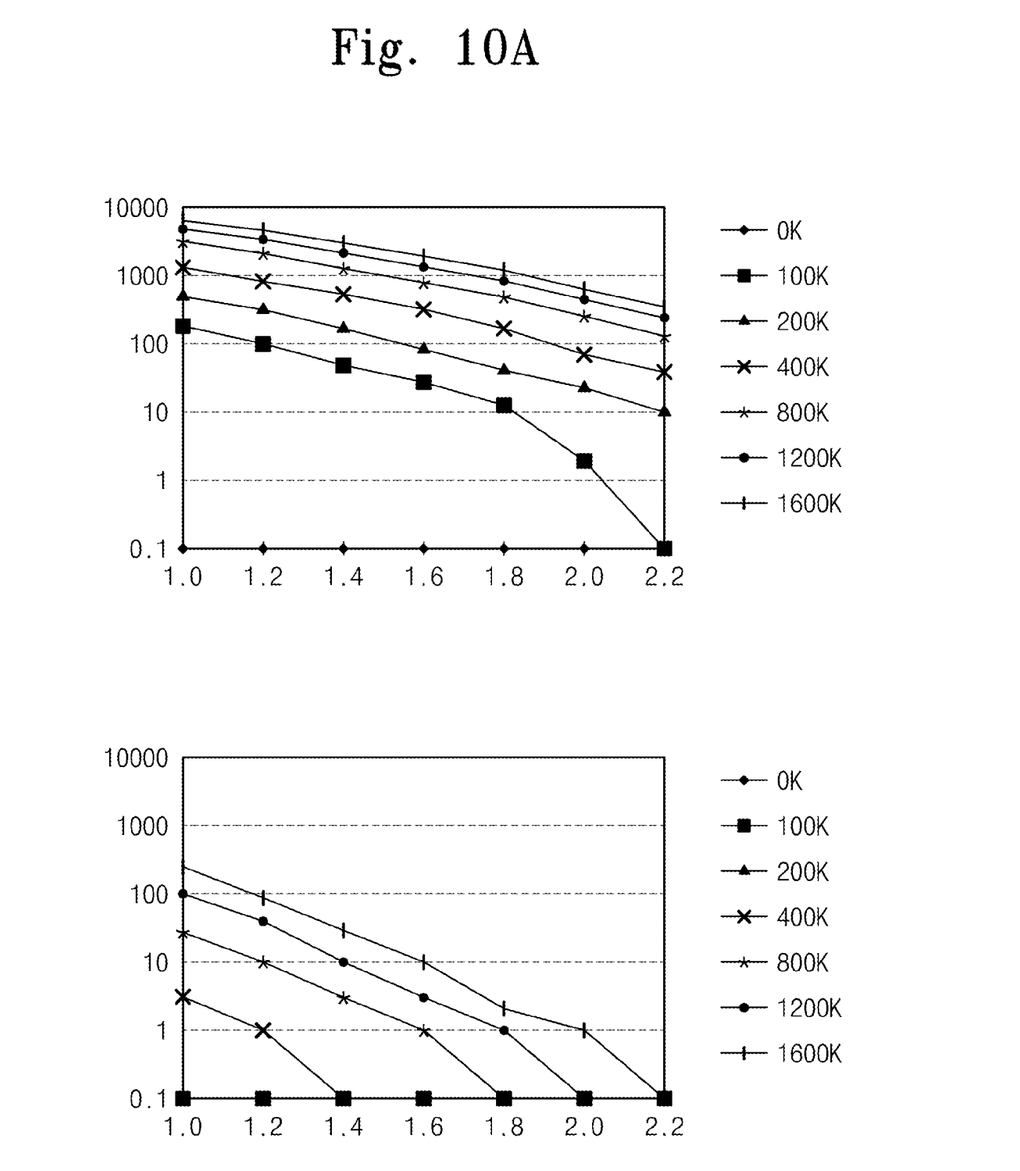
FIGS. 10A and 10B are graphs describing program results of a program method according to a conventional program method and an example embodiment of the inventive concepts.
Figure 10B:
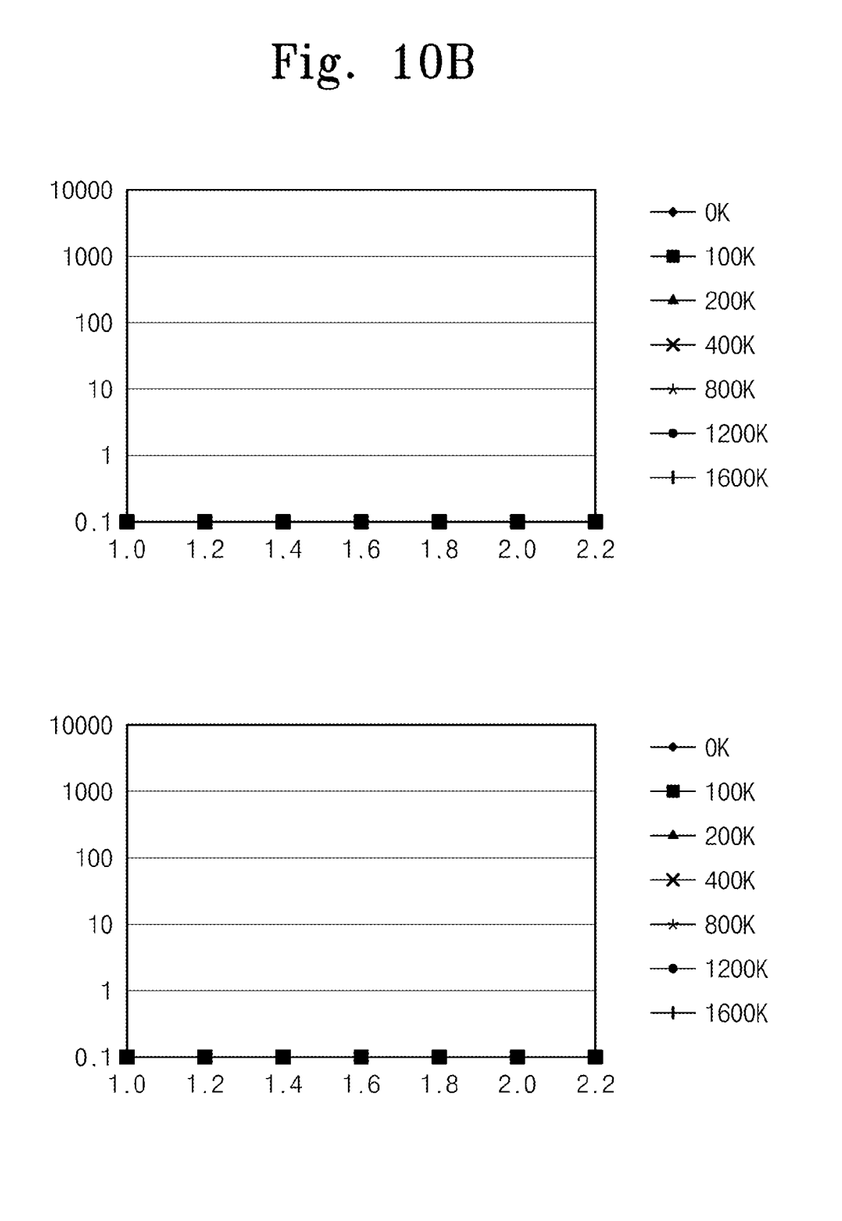

FIGS. 10A and 10B are graphs describing program results of a program method according to a conventional program method and an example embodiment of the inventive concepts. FIG. 10A shows a program result according to a conventional method, and FIG. 10B shows a program result according to an example embodiment of the inventive concepts.

In FIGS. 10A and 10B, upper graphs show FN tunneling program disturbance of memory cells (a case of MC3, refer to FIGS. 6 and 7) on a different row and the same column from a selected memory cell MC1, and lower graphs show hot electron injection program disturbance of a memory cell (a case of MC4) on different row and a different column from the selected memory cell MC1.

In each graph of FIGS. 10A and 10B, a horizontal axis may indicate threshold voltages of unselected memory cells (case of MC3 or MC4), and a vertical axis may indicate the number of memory cells (case of MC3 or MC4).

As illustrated in FIG. 10A, when a conventional program method is used, the number of memory cells (case of MC3) experiencing the FN tunneling program disturbance may increase each iteration of a program cycle. Further, the number of memory cells (case of MC4) experiencing the hot electron injection program disturbance may increase each iteration of the program cycle. On the other hand, as illustrated in FIG. 10B, when a program method according to an example embodiment of the inventive concepts is used, memory cells experiencing the FN tunneling program disturbance and the hot electron injection program disturbance do not exist.

Figure 11:
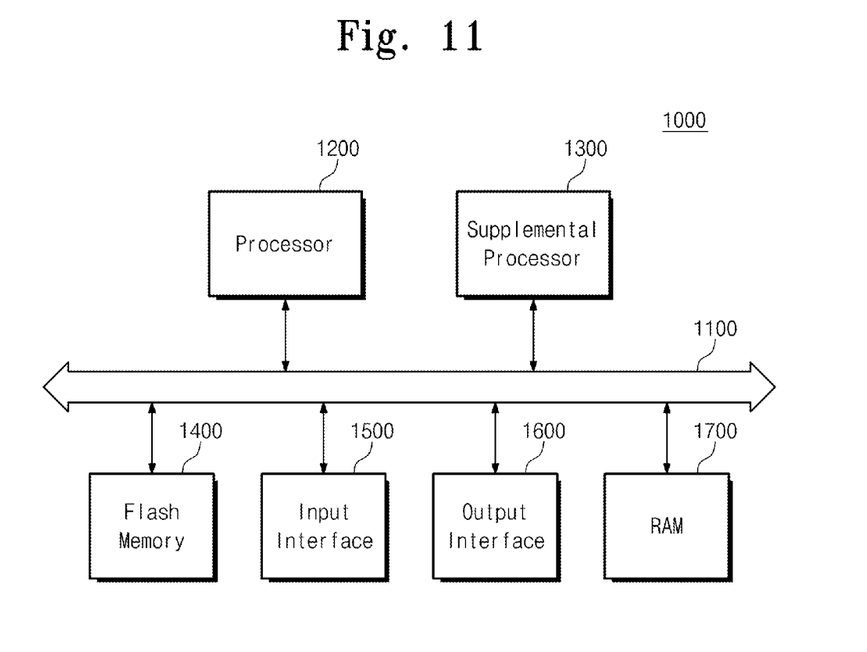
FIG. 11 is a block diagram schematically illustrating an embedded system according to an example embodiment of the inventive concepts.

FIG. 11 is a block diagram schematically illustrating an embedded system according to an example embodiment of the inventive concepts. Referring to FIG. 11, an embedded system 1000 may include a system bus 1100, a processor 1200, a supplemental processor 1300, a flash memory 1400, an input interface 1500, an output interface 1600, and a RAM 1700.

The system bus 1100 may provide channels between elements of the embedded system 1000.

The processor 1200 may be configured to control an overall operation of the embedded system 1000. The processor 1200 may include a general purpose processor or an Application Processor (AP).

The supplemental processor 1300 may be used to supplement an operation of the processor 1200. The supplemental processor 1300 may include an image processor (or, codec), a sound processor (or, codec), a compression and de-compression processor (or, codec), and a cipher and de-cipher processor (or, codec).

The flash memory 1400 may include a 2-transistor flash memory 100 according to an example embodiment of the inventive concepts described in relation to FIGS. 1 to 10. The flash memory 1400 may have such structure and program method as described in relation to FIGS. 1 to 10.

The input interface 1500 may include devices receiving signals from the outside of the embedded system 1000. The input interface 1500 may include at least one input device such as a button, a keyboard, a mouse, a microphone, a camera, a touch panel, a touch screen, or a wire/wireless receiver.

The output interface 1600 may include devices transmitting signals that the embedded system 1000 transmits to the outside. The output interface 1600 may include at least one output device such as a monitor, a lamp, a speaker, a printer, a monitor, or a wire/wireless transmitter.

The RAM 1700 may act as a working memory of the embedded system 1000.

In some example embodiments, a control gate of a cell transistor in an unselected memory cell on a different row from a selected memory cell may be floated during programming. Thus, program disturbance of an unselected memory cell may be prevented, and a 2-transistor flash memory with the improved reliability and a program method of the 2-transistor flash memory may be provided.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A 2-transistor flash memory comprising:
a memory cell array including a plurality of memory cells each having a pair of (1) a cell transistor and (2) a selection transistor connected to the cell transistor in series;
a row driver connected to cell transistors of memory cells on a same row via global control lines and byte selection transistors, the row driver connected to selection transistors of memory cells on the same row via word lines;
a read/write circuit connected to each of the plurality of memory cells on a same column via global bit lines and sector selection transistors, the read/write circuit configured to control the byte selection transistors via byte control lines;
a charge pump configured to generate a positive high voltage; and
control logic configured to transfer the positive high voltage to the row driver, the read/write circuit, and the memory cell array,
wherein when programming, the row driver and the read/write circuit are configured to apply voltages such that a control gate of a cell transistor in an unselected memory cell on a different row from a selected memory cell is floated.

2. The 2-transistor flash memory of claim 1, wherein when programming, the row driver and the read/write circuit are configured to apply a same voltage to a global control line and a byte control line corresponding to an unselected memory cell on the different row from the selected memory cell.

3. The 2-transistor flash memory of claim 1, wherein when programming, the row driver and the read/write circuit apply a negative intermediate voltage to a global control line and a byte control line corresponding to the unselected memory cell on the different row from the selected memory cell.

4. The 2-transistor flash memory of claim 1, wherein when programming, the row driver and the read/write circuit apply a ground voltage to a global control line and a byte control line corresponding to the unselected memory cell on the different row from the selected memory cell.

5. The 2-transistor flash memory of claim 1, wherein when programming, the row driver applies a first positive high voltage to a selected global control line and the read/write circuit applies a second positive high voltage to an unselected byte control line.

6. The 2-transistor flash memory of claim 1, wherein when programming, a byte selection transistor connected to a global control line and a byte control line corresponding to the unselected memory cell on the different row from the selected memory cell is turned off by voltages of the global control line and the byte selection transistor.

7. The 2-transistor flash memory of claim 1, wherein the plurality of memory cells forms a first sector and a second sector, memory cells in each of the first and second sectors form a plurality of strings each including a plurality of memory cells connected in series.

8. The 2-transistor flash memory of claim 7, wherein each of the plurality of strings is connected to a global bit line via a corresponding sector selection line.

9. The 2-transistor flash memory of claim 1, wherein when programming, a common source of the selection transistor and the cell transistor is floated.

10. The 2-transistor flash memory of claim 1, wherein when programming, a negative high voltage is applied to a selected global bit line and a ground voltage is applied to an unselected global bit line.

11. A program method of a 2-transistor flash memory that includes a plurality of memory cells each having a pair of (1) a cell transistor and (2) a selection transistor connected to the cell transistor in series, cell transistors in a same row being connected to a same global control line via a byte selection transistor and memory cells in a same column being connected to a same global bit line via sector selection transistor, the program method comprising:
performing programming by applying a program voltage to a cell transistor of a selected memory cell; and
performing program inhibition by floating a control gate of a cell transistor of an unselected memory cell on a different row from the selected memory cell.

12. The program method of claim 11, wherein performing programming includes applying a same voltage to a global control line connected to the cell transistor of the unselected memory cell and a gate of a byte selection transistor connected to the global control line.

13. The program method of claim 12, wherein a negative intermediate voltage is applied to the global control line connected to the cell transistor of the unselected memory cell and the gate of the byte control transistor connected to the global control line.

14. The program method of claim 12, wherein a ground voltage is applied to the global control line connected to the cell transistor of the unselected memory cell and the gate of the byte selection transistor connected to the global control line.

15. The program method of claim 11, wherein the byte selection transistor connected with a control gate of the unselected memory cell is turned off.

16. A 2-transistor flash memory comprising:
a plurality of rows, each row including a plurality of memory cells, each memory cell including a pair of a cell transistor and a selection transistor connected to the cell transistor in series; and
byte selection transistors connected to one or more cell transistor,
wherein when programming a selected memory cell, the byte selection transistors are configured to float one or more control gates of one or more cell transistors in corresponding one or more unselected memory cells included in a row immediately adjacent to a row including the selected memory cell.

17. The 2-transistor flash memory of claim 16, wherein the byte selection transistors are configured to receive voltages from control logic in order to float the control gate of the cell transistor in the unselected memory cell.

18. The 2-transistor flash memory of claim 17, wherein the byte selection transistors are configured to only float the control gate of the cell transistor in the unselected memory cell when the unselected memory cell is in a selected column, the selected column having a plurality of memory cells including the selected memory cell.

19. The program method of claim 11, wherein the selected memory cell and the unselected memory cell is directly connected in series in a same column,
wherein the memory cells in the same column is directly connected to the sector selection transistor.

20. The 2-transistor flash memory of claim 16, wherein the byte selection transistors are configured to transfer a program voltage to a control gate of a cell transistor in the selected memory cell,
wherein selection transistors of the selected memory cell and an unselected memory cell are directly connected in series in a same column,
wherein cell transistors of the selected memory cell and the unselected memory cell is directly connected to a bit line in the same column.

* * * * *